(12) United States Patent
Ito

(10) Patent No.: US 8,469,346 B2
(45) Date of Patent: Jun. 25, 2013

(54) SUBSTRATE MOUNTING MECHANISM AND SUBSTRATE PROCESSING APPARATUS USING SAME

(75) Inventor: Takeshi Ito, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 334 days.

(21) Appl. No.: 12/848,424

(22) Filed: Aug. 2, 2010

(65) Prior Publication Data

US 2011/0024963 A1 Feb. 3, 2011

(30) Foreign Application Priority Data

Aug. 3, 2009 (JP) .................................. 2009-180731

(51) Int. Cl.
*B23Q 3/00* (2006.01)

(52) U.S. Cl.
USPC .......................... 269/289 R; 269/909; 414/941

(58) Field of Classification Search
USPC ................ 118/503–504, 724–725, 728–729; 204/298.35; 269/21, 50, 903; 414/941
IPC ....................... B65G 49/07; C23C 14/50; H01L 21/67, 21/673, 21/68, 21/683
See application file for complete search history.

(56) References Cited

U.S. PATENT DOCUMENTS

| 4,812,201 | A | * | 3/1989 | Sakai et al. | 438/725 |
| 5,162,633 | A | * | 11/1992 | Sonobe et al. | 219/121.43 |
| 5,334,257 | A | * | 8/1994 | Nishi et al. | 118/500 |
| 5,834,737 | A | * | 11/1998 | Hirose et al. | 219/385 |
| 5,879,128 | A | * | 3/1999 | Tietz et al. | 414/757 |
| 6,644,965 | B2 | * | 11/2003 | Ookura et al. | 432/253 |
| 6,935,466 | B2 | * | 8/2005 | Lubomirsky et al. | 187/250 |
| 6,955,741 | B2 | * | 10/2005 | Yamagishi | 156/345.51 |
| 6,964,276 | B2 | * | 11/2005 | Shulman et al. | 134/133 |
| 2002/0092615 | A1 | * | 7/2002 | Iida | 156/345.31 |
| 2003/0000075 | A1 | * | 1/2003 | Ogimoto | 29/729 |
| 2004/0104139 | A1 | * | 6/2004 | Yoshizawa | 206/454 |
| 2005/0172903 | A1 | * | 8/2005 | Morita | 118/723 MW |
| 2008/0223399 | A1 | * | 9/2008 | Onishi | 134/1.3 |

FOREIGN PATENT DOCUMENTS

| JP | 8-288373 | | 11/1996 |
| JP | 08288373 | A * | 11/1996 |
| JP | 10214879 | A * | 8/1998 |
| JP | 2006-344675 | | 12/2006 |
| JP | 3891627 | | 3/2007 |
| JP | 2007250988 | A * | 9/2007 |
| JP | 2008084902 | A * | 4/2008 |

OTHER PUBLICATIONS

Comb—Definition. Hyperdictionary.com. http://www.hyperdictionary.com/search.aspx?define=comb.*

* cited by examiner

*Primary Examiner* — Lee D Wilson
*Assistant Examiner* — Tyrone V Hall, Jr.
(74) *Attorney, Agent, or Firm* — Oblon, Spivak, McClelland, Maier & Neustadt, L.L.P.

(57) ABSTRACT

A substrate mounting mechanism includes a substrate mounting table for mounting a substrate thereon; a heat source for supplying a heat or a cold heat to the substrate via the substrate mounting table; a substrate elevating member movable, having a substrate-supporting portion for supporting an end portion of the substrate, the substrate elevating member being upwardly and downwardly between a first position at which the substrate is mounted on the substrate mounting table and a second position that is located above the first position; and an elevating unit for upwardly and downwardly moving the substrate elevating member. The substrate elevating member serves as a part of the substrate mounting table at the first position.

12 Claims, 9 Drawing Sheets

US 8,469,346 B2

SUBSTRATE MOUNTING MECHANISM AND SUBSTRATE PROCESSING APPARATUS USING SAME

CROSS-REFERENCE TO RELATED APPLICATIONS

This application claims priority to Japanese Patent Application No. 2009-180731 filed on Aug. 3, 2009, the entire contents of which are incorporated herein by reference.

FIELD OF THE INVENTION

The present invention relates to a substrate mounting mechanism which mounts a substrate used for a flat panel display (FDP), a solar battery, or the like; and a processing system having the same, which performs a process on the substrate mounted by using the substrate mounting mechanism.

BACKGROUND OF THE INVENTION

In the process of manufacturing a substrate used in a flat panel display (FPD), a solar battery, or the like, various processes such as a film-forming process, an etching process, a heating process, and the like are typically carried out by using a substrate processing apparatus which provides a substrate mounting table in a chamber therein and mounts a substrate on the substrate mounting table to process the substrate thereon.

In such a substrate processing apparatus, the substrate is mounted onto and dismounted from the substrate mounting table by allowing lift pins to protrude upwardly and retreat downwardly (see, e.g., Japanese Patent Application Publication No. 2006-344675). Specifically, when the substrate is mounted onto the substrate mounting table, the lift pins are allowed to protrude upwardly and the substrate is transferred onto the protruding lift pins by a transfer arm. Then, the lift pins are retreated downwardly to mount the substrate on the substrate mounting table. When the substrate is dismounted from the substrate mounting table, the lift pins are allowed to protrude upwardly to dismount the substrate from the substrate mounting table. Then, the dismounted substrate is transferred by the transfer arm.

Meanwhile, the process, e.g., the film-forming process or the heating process, is carried out on the substrate while heating the substrate by a heater provided in the substrate mounting table. Since, however, holes through which the lift pins are inserted are formed on the substrate mounting table, the substrate is not directly in contact with the substrate mounting table at the portions thereof where the holes are formed. Accordingly, a heat amount transferred at the portions where the substrate is not directly in contact with the substrate mounting table becomes different from that transferred at the portion where the substrate is directly in contact with the substrate mounting table. For that reason, the in-plane temperature of the substrate becomes non-uniform.

SUMMARY OF THE INVENTION

In view of the above, the present invention provides a substrate mounting mechanism and a substrate processing apparatus using the same, capable of making the in-plane temperature of a substrate uniform.

In accordance with a first aspect of the present invention, there is provided a substrate mounting mechanism including: a substrate mounting table for mounting a substrate thereon; a heat source for supplying a heat or a cold heat to the substrate via the substrate mounting table; a substrate elevating member movable having a substrate-supporting portion for supporting an end portion of the substrate, the substrate elevating member being upwardly and downwardly between a first position at which the substrate is mounted on the substrate mounting table and a second position that is located above the first position; and an elevating unit for upwardly and downwardly moving the substrate elevating member. Here, the substrate elevating member serves as a part of the substrate mounting table at the first position.

In accordance with a second aspect of the present invention, there is provided a substrate processing apparatus including: a vessel for accommodating a substrate therein; and the substrate mounting mechanism of the first aspect.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
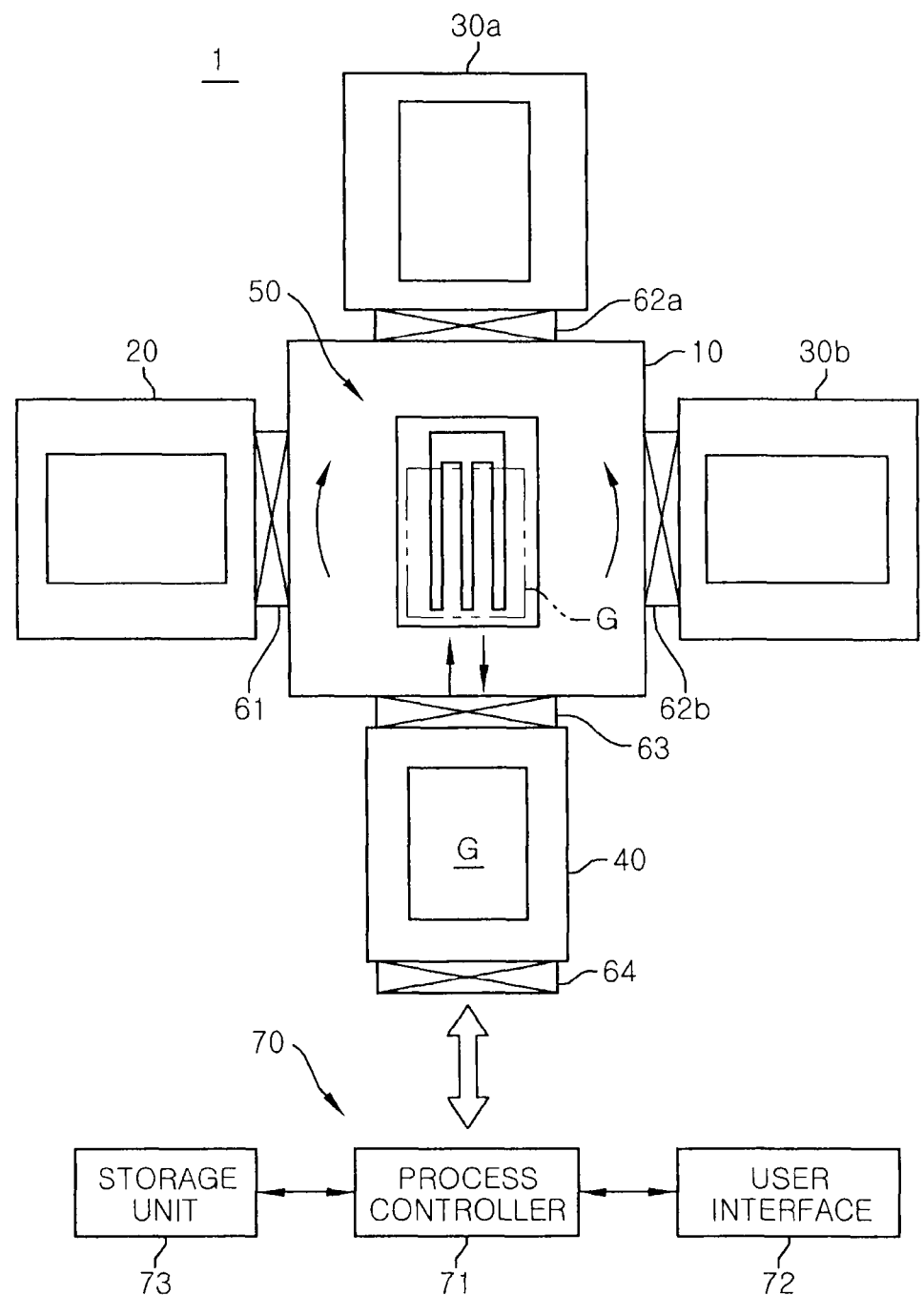
FIG. 1 is a schematic plan view showing a substrate processing system including a preheating chamber (substrate processing apparatus) in accordance with an embodiment of the present invention.

An embodiment of the present invention will now be described with reference to the accompanying drawings which form a part hereof. Further, in the following description and drawings, components having substantially the same configurations are assigned with same reference numerals, respectively.

FIG. 1 is a schematic plan view showing a substrate processing system 1 including a preheating chamber (substrate processing apparatus) in accordance with an embodiment of the present invention. The substrate processing system 1 may be a film-forming system which forms a predetermined film on a rectangular substrate, e.g., a glass substrate used for a flat panel display (FPD) such as a liquid crystal display (LCD).

As shown in FIG. 1, the substrate processing system 1 includes a common transfer chamber 10; a preheating chamber constituting a preheating apparatus for preheating a substrate G; processing chambers 30a and 30b, each constituting a film-forming apparatus for forming a predetermined film on the substrate G; a load-lock chamber for switching the substrate G between a substrate container (not shown) disposed in an atmosphere and the common transfer chamber 10 that is maintained in a vacuum state; and a transfer device 50 provided in the common transfer chamber 10 to transfer the substrate G.

The common transfer chamber 10 is formed in a rectangular shape seen from the top. The preheating chamber 20, the processing chambers 30a and 30b, the load-lock chamber 40 are connected to side surfaces of the common transfer chamber 10 through gate valves 61, 62a, 62b, and 63, respectively. In addition, a gate valve 64 is provided on the atmospheric side of the load-lock chamber 40. Although the common transfer chamber 10 of the present embodiment has the rectangular shape seen from the top as described above, the common transfer chamber 10 may have a polygonal (e.g., hexagonal or octagonal) shape, and the preheating chamber, the processing chamber, and the load-lock chamber may additionally be provided.

In the present embodiment, the common transfer chamber 10, the preheating chamber 20, and the processing chambers 30a and 30b are respectively configured as vacuum chambers that are maintained in a predetermined depressurized state. Furthermore, the load-lock chamber 40 is provided to transfer the substrate G between the substrate container (not shown) disposed in the atmosphere and the common transfer chamber 10 maintained in a vacuum state, the load-lock chamber 40 serving as a vacuum prechamber that can be switched between the atmospheric state and the depressurized state.

The substrate processing system 1 is configured to process at a time a plurality of, e.g., three, substrates G mounted horizontally and arranged above one another in a vertical direction. The substrates G are loaded together from the external substrate container into the load-lock chamber 40 through the gate valve 64 by a transfer unit (not shown) in an atmosphere. The loaded substrates G are transferred from the load-lock chamber 40 to the common transfer chamber 10, from the common transfer chamber 10 to the preheating chamber 20, and from the preheating chamber 20 to the processing chambers 30a or 30b through the gate valves 63, 61, and 62a or 62b, respectively.

The substrates G processed in the processing chamber 30a or 30b are transferred from the processing chamber 30a or 30b to the common transfer chamber 10 and from the common transfer chamber 10 to the load-lock chamber 40 through the gate valves 62a or 62b and 63, respectively. Then, the processed substrates G are unloaded from the load-lock chamber 40. Although the processing chambers 30a and 30b perform the same film-forming process in the present embodiment, the processing chambers 30a and 30b may be configured to perform different film-forming processes. In other words, a first film-forming process may be carried out in the processing chamber 30a and, successively, a second film-forming process may be performed in the processing chamber 30b.

Figure 2:
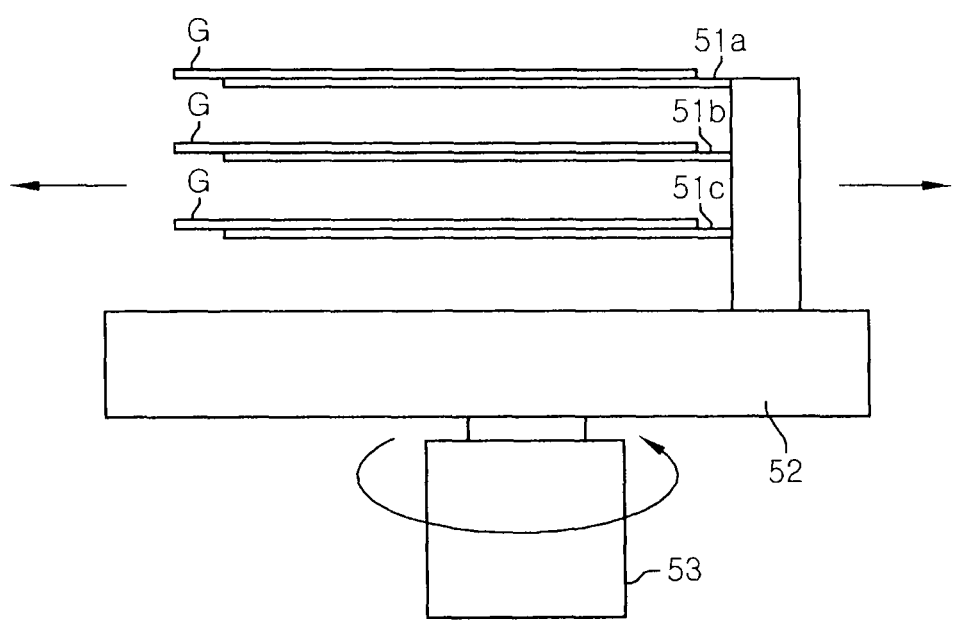
FIG. 2 schematically shows a substrate transfer device of the substrate processing system shown in FIG. 1.

The substrate transfer device 50 serves to transfer the substrates G between the common transfer chamber 10, the preheating chamber 20, the processing chambers 30a and 30b, and the load-lock chamber 40. As shown in FIG. 2, the substrate transfer device 50 includes a rotatable base member 52; three substrate support arms 51a, 51b and 51c configured to linearly move above the base member 52, the substrate support arms 51a, 51b and 51c being arranged above one another in the vertical direction; and a driving unit 53 for rotating the base member 52. By moving the substrate support arms 51a to 51c back and forth and rotating the base member 52, the substrate transfer device 50 can allow the substrate support arms 51a to 51c to access the preheating chamber 20, the processing chambers 30a and 30b and the load-lock chamber 40.

The respective components of the processing system 1 are controlled by a control unit (computer) 70. The control unit 70 includes a process controller 71 having a micro processor. The process controller 71 is connected to a user interface 72 including a keyboard through which an operator inputs a command or the like to manage the processing system 1, a display unit for visually displaying an operation status of the processing system 1, and the like. Further, the process controller 71 is connected to a storage unit 73 which stores therein control programs for realizing various processes performed by the processing system 1 under the control of the process controller 71; and control programs or recipes for performing predetermined processes performed by the processing system 1 under processing conditions. The storage unit 73 has a storage medium which stores therein the recipes or the like.

The storage medium may be a hard disk, a semiconductor memory or a portable storage medium such as a CD-ROM, a DVD, a flash memory or the like. If necessary, a certain recipe is retrieved from the storage unit 73 in response to an instruction from the user interface 72 or the like and is executed by the process controller 71, thereby performing a desired process in the processing system 1 under the control of the process controller 71.

In the substrate processing system 1 configured as described above, the gate valve 64 is first opened and a plurality of, e.g., three, substrates G is loaded into the load-lock chamber 40 in the atmospheric state by a substrate transfer device (not shown) disposed in the atmosphere. Next, the gate valve 64 is closed, and the inside of the load-lock chamber 40 is set to a depressurized state. Then, the gate valve 63 is opened, and the substrate support arms 51a to 51c of the substrate transfer device 50 are moved into the load-lock chamber 40 at a time to take the substrates G loaded to the load-lock chamber 40. Thereafter, the substrate support arms 51a to 51c of the substrate transfer device 50 return to the common transfer chamber 10, and the gate valve 63 is closed.

Next, the base member 52 of the substrate transfer device 50 is rotated such that the substrate support arms 51a to 51c are positioned to face the preheating chamber 20. Then, the gate valve 61 is opened, and the substrate support arms 51a to 51c are moved into the preheating chamber 20 to transfer the substrates G to the preheating chamber 20. Thereafter, the substrate support arms 51a to 51c return to the common transfer chamber 10, and the gate valve 61 is closed such that preheating of the substrates G can be started in the preheating chamber 20.

Upon completion of the preheating, the gate valve 61 is opened, and the substrate support arms 51a to 51c are moved into the preheating chamber 20 to take the preheated substrates G. Next, the substrate support arms 51a to 51c return to the common transfer chamber 10, and the gate valve 61 is closed. Then, the base member 52 is rotated such that the substrate support arms 51a to 51c are positioned to face the processing chamber 30a or 30b. Thereafter, the gate valve 62a or 62b is opened, and the substrate support arms 51a to 51c are moved into the processing chamber 30a or 30b to transfer the preheated substrates G to the processing chamber 30a or 30b. Next, the substrate support arms 51a to 51c return to the common transfer chamber 10, and the gate valve 62a or 62b is closed such that processing in the processing chamber 30a or 30b is started.

Upon completion of the processing, the gate valve 62a or 62b is opened, and the substrate support arms 51a to 51c are moved into the processing chamber 30a or 30b to take the processed substrates G. Then, the substrate support arms 51a to 51c return to the common transfer chamber 10, and the gate valve 62a or 62b is closed. Thereafter, the base member 52 is rotated such that the substrate support arms 51a to 51c are positioned to face the load-lock chamber 40. Next, the gate valve 63 is opened, and the substrate support arms 51a to 51c are moved into the load-lock chamber 40 to transfer the processed substrates G to the load-lock chamber 40. Thereafter, the substrate support arms 51a to 51c return to the common transfer chamber 10, and the gate valve 63 is closed such that the inside of the load-lock chamber 40 can be set to the atmospheric state. Then, the gate valve 64 is opened, and the processed substrates G are unloaded from the load-lock chamber 40 by the transfer unit (not shown) disposed in the atmosphere.

Figure 3:
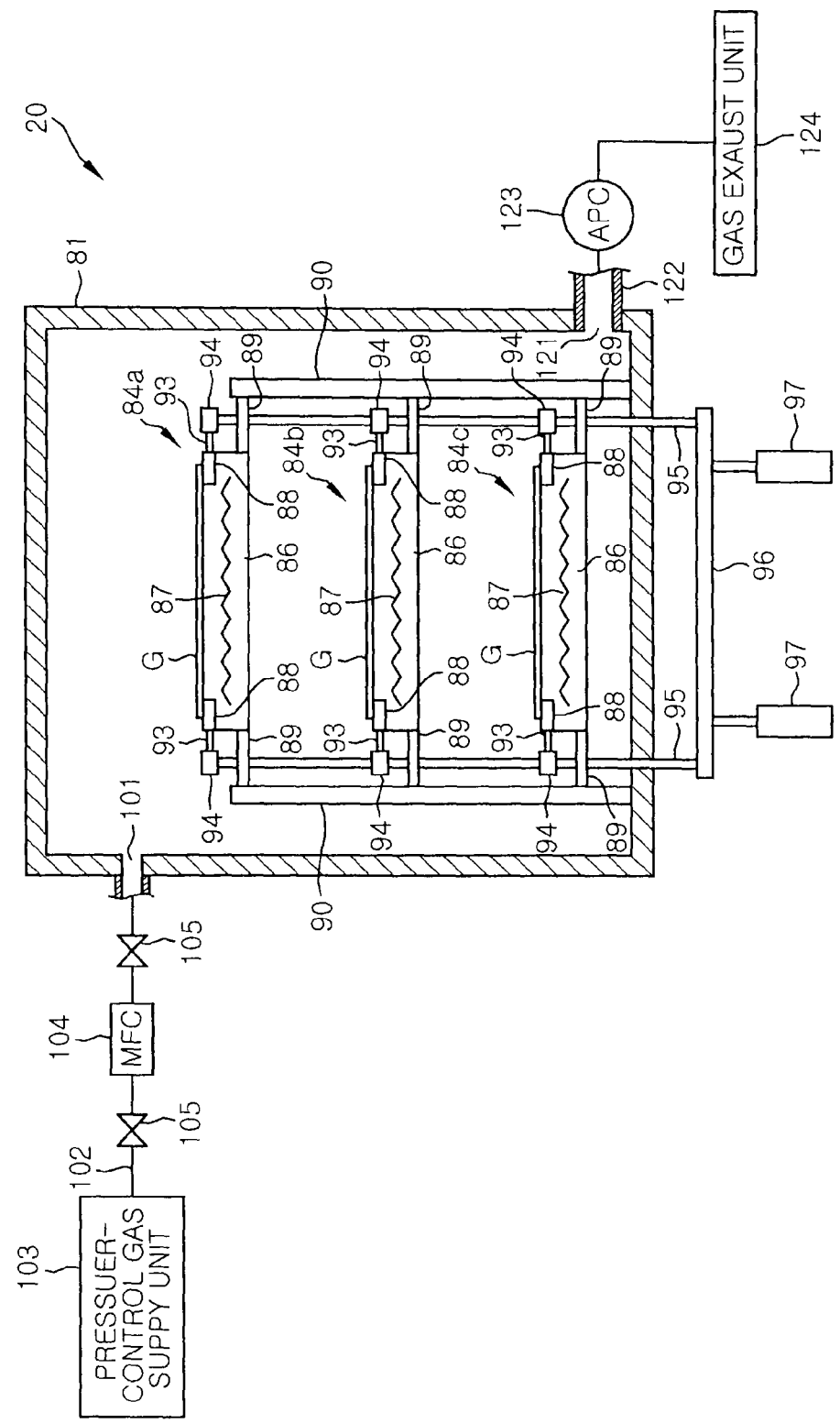
FIG. 3 is a vertical cross sectional view showing the preheating chamber (substrate processing apparatus) of the substrate processing system shown in FIG. 1.
Figure 4:
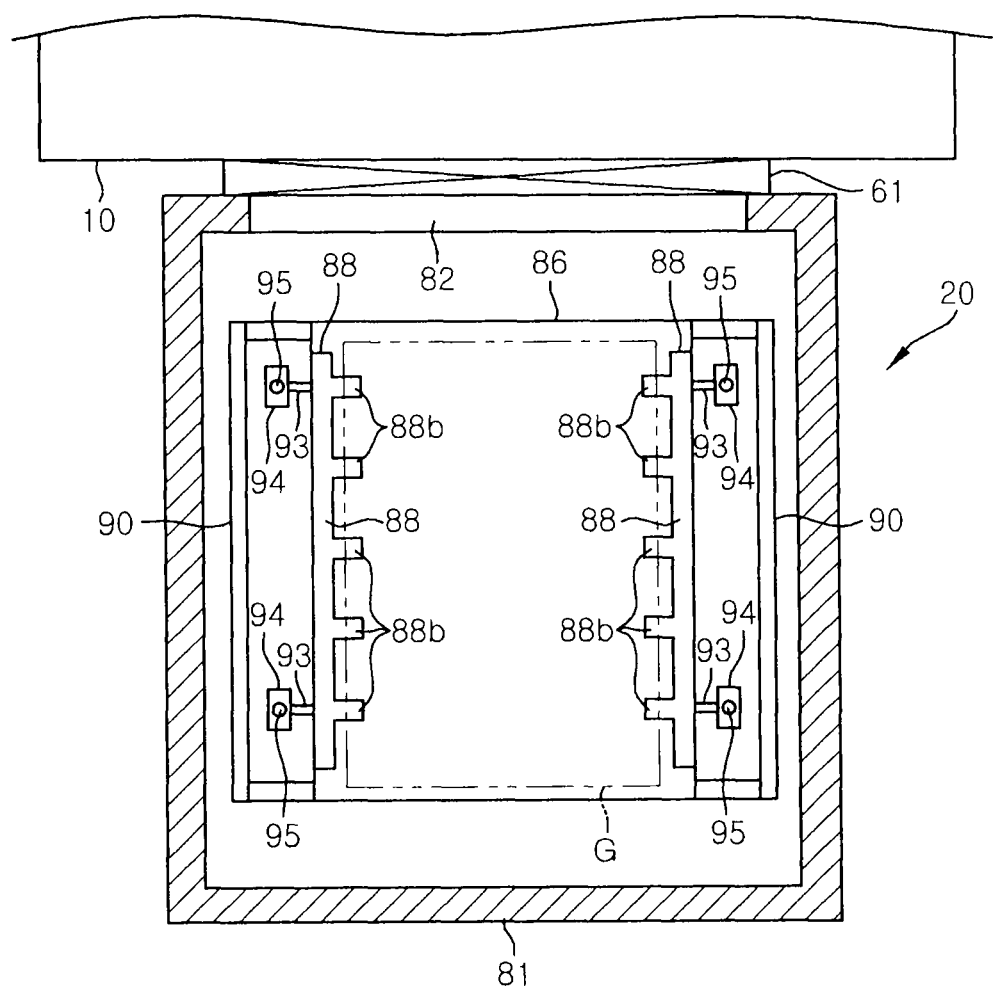
FIG. 4 is a horizontal cross sectional view showing the preheating chamber (substrate processing apparatus) of the substrate processing system shown in FIG. 1.

Next, the preheating chamber (substrate processing apparatus) 20 will be described in detail. FIGS. 3 and 4 are a vertical and a horizontal cross sectional view, respectively, showing the preheating chamber 20.

The preheating chamber 20 includes a vessel 81, and an opening 82 is provided on a sidewall of the vessel 81. The preheating chamber 20 can communicate with the common transfer chamber 10 that is maintained in a vacuum state through the opening 82 which can be opened and closed by the gate valve 61.

Arranged at a predetermined interval in the vertical direction are three substrate mounting mechanisms 84a, 84b, and 84c for respectively mounting and heating three substrates G therein.

Each of the substrate mounting mechanisms 84a, 84b, and 84c has a rectangular shape seen from the top. Each of the substrate mounting mechanisms 84a, 84b, and 84c includes a substrate mounting table 86 made of a metal material. A heater 87 is buried in each of the substrate mounting mechanisms 84a, 84b, and 84c. Heat is radiated from each of the heaters 87 to which a power is supplied from a power supply (not shown), and the substrates G mounted on the respective substrate mounting tables 86 are heated to a predetermined level.

Each of the substrate mounting mechanisms 84a, 84b, and 84c further includes a pair of comb-shaped substrate elevating members 88 provided on opposite upper end portions of longer sides of the substrate mounting table 86. The substrate elevating members 88 serve to support and upwardly and downwardly move the substrates G and form parts of the respective substrate mounting tables 86 when being mounted thereon. Further, top surfaces of the substrate elevating members 88 and each corresponding substrate mounting table 86 are arranged flush with each other. Meanwhile, although the substrate mounting tables 86 are made of a metal material in the present embodiment, they may be made of a ceramic material.

The substrate mounting tables 86 of the substrate mounting mechanisms 84a, 84b, and 84c are connected to a plurality of frames 90 extending vertically by connection members 89. The frames 90 are attached to a bottom portion of the vessel 81.

As shown in FIG. 4, each of the substrate elevating members 88 of the substrate mounting mechanisms 84a, 84b, and 84c is engaged with two latch bars 93 connected to connection members 94. Two connection members 94 corresponding to each of the substrate elevating members 88 of the substrate mounting tables 86 arranged in three stages are respectively connected to vertically extending two connection shafts 95.

The connection shafts 95, four in total, i.e., one connection shaft 95 being located near to each corner of the substrate mounting tables 86, downwardly extend through the bottom of the vessel 81 and are supported by a supporting plate 96. The supporting plate 96 is moved upwardly and downwardly by two elevating units (e.g., cylinder mechanisms) 97. Accordingly, as the supporting plate 96 is moved upwardly and downwardly, the substrate elevating members 88 can be moved upwardly and downwardly.

Figure 5A:
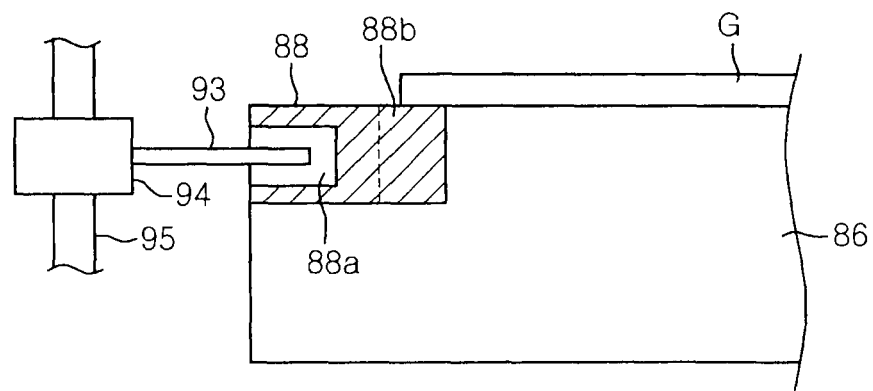
FIGS. 5A and 5B are cross sectional views showing main parts of a substrate mounting mechanism used in the preheating chamber.
Figure 5B:
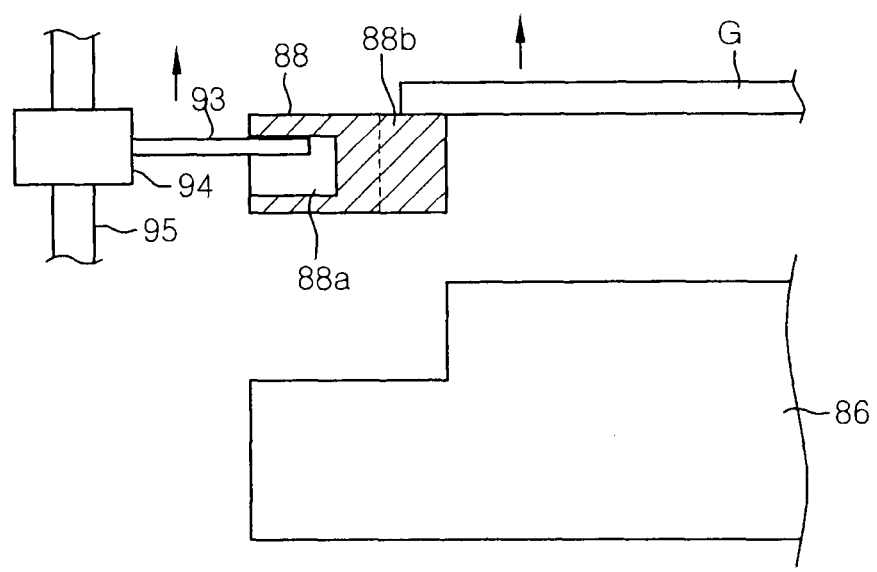

As shown in FIGS. 5A and 5B, a cavity 88a is provided in each of the substrate elevating members 88 and the latch rod 93 is inserted in the cavity 88a. When the substrate elevating member 88 is placed at a reference position where it is not moved upwardly, the substrate elevating member 88 is mounted on the corresponding substrate mounting table 86; and the latch rod 93 is positioned in the cavity 88a without being in contact with the substrate elevating member 88 as shown in FIG. 5A. On the other hand, when the substrate elevating member 88 is moved upwardly, the latch rod 93 becomes brought into contact with a top surface of the cavity 88a as shown in FIG. 5B.

Figure 6:
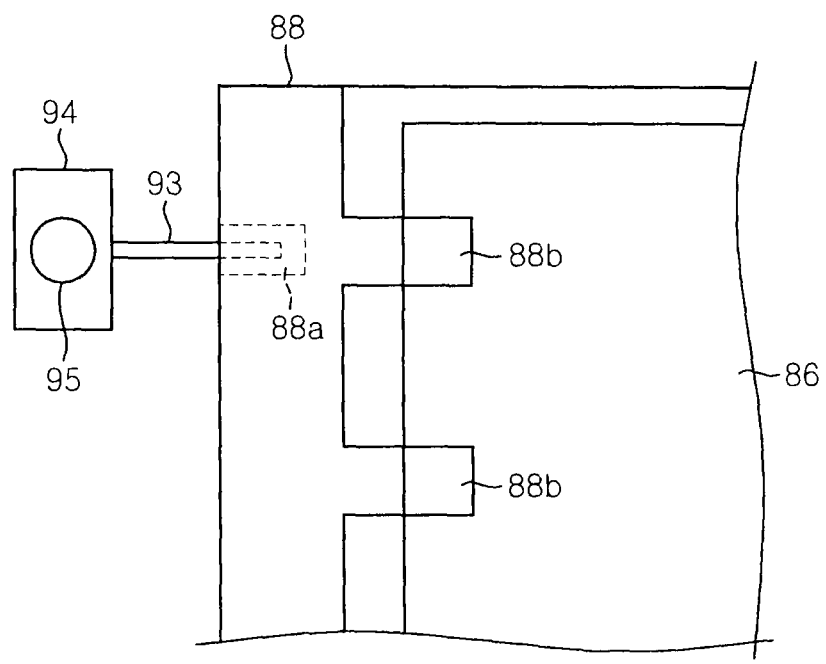
FIG. 6 is a plan view showing main parts of a substrate mounting mechanism used in the preheating chamber.

Further, as shown in FIG. 6, the comb-shaped substrate elevating member 88 has a plurality of protrusions 88b protruding to an inward side of the corresponding substrate mounting table 86. The protrusions 88b serve to support the substrate G with a minimum area. The cavity 88a is provided apart from the protrusions 88b for supporting the substrate G.

Formed on the bottom of the vessel 81 are holes through which the connection shafts 95 are inserted, and seal mechanisms (not shown) are provided in the holes. Accordingly, the connection shafts 95 can be moved upwardly and downwardly in an airtight state.

A gas introduction port 101 is provided on a side surface of the vessel 81, and a gas supply line 102 is connected to the gas introduction port 101. The gas supply line 102 is connected to a pressure-control gas supply source 103. A mass flow controller 104 for controlling a mass flow and two on-off valves 105 are provided in the gas supply line 102. The mass flow controller 104 is placed between the on-off valves 105. A pressure-control gas such as Ar gas or $N_2$ gas is supplied from the pressure-control gas supply source 103 to the vessel 81 through the gas supply line 102.

A gas exhaust port 121 for exhausting the vessel 81 is provided at a lower portion of the sidewall of the vessel 81, and a gas exhaust line 122 is connected to the gas exhaust port 121. In the gas exhaust line 122, an automatic pressure control valve 123 and the gas exhaust unit 124 are provided. The pressure inside the vessel 81 is controlled by the automatic pressure control valve 123, and the vessel 81 is set to a vacuum state by the gas exhaust unit 124.

Moreover, the vessel 81 is set to a predetermined depressurized state, and the substrates G mounted on the substrate mounting tables 86 are heated to a predetermined temperature by supplying powers to the heaters 87 of the substrate mounting mechanisms 84a, 84b, and 84c to perform the preheating process.

Figure 7A:
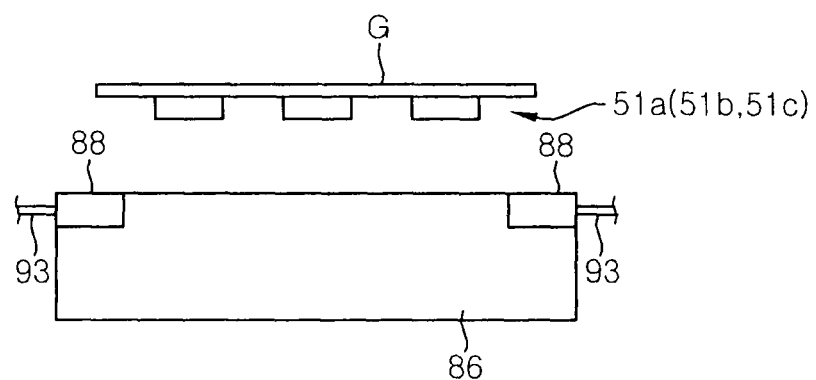
FIGS. 7A to 7C are schematic plan views showing how a substrate is mounted on a substrate mounting table.
Figure 7B:
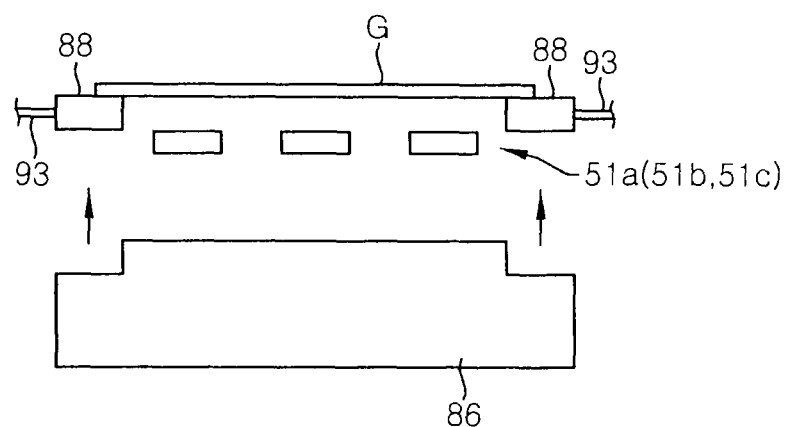

In the preheating chamber 20 having such configuration, the gate valve 61 is first opened, and the substrates G supported on the substrate support arms 51a, 51b, and 51c of the substrate transfer device 50 are loaded through the opening 82 in the preheating chamber 20 as shown in FIG. 7A. Then, as shown in FIG. 7B, the substrate elevating members 88 of the respective substrate mounting mechanisms 84a, 84b, and 84c are moved upwardly, and the substrates G on the substrate support arms 51a, 51b, and 51c are respectively placed on the protrusions 88b of the substrate elevating members 88 that are moved upwardly to respective delivery positions above the substrate mounting tables 86.

Figure 7C:
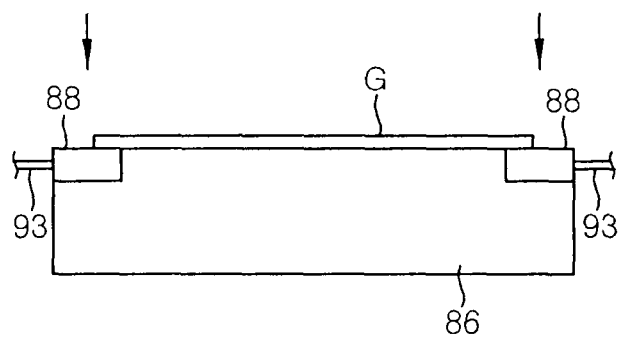

Thereafter, the substrate support arms 51a, 51b, and 51c of the substrate transfer device 50 return to the common transfer chamber 10. Then, as shown in FIG. 7C, the substrate elevating members 88 on which the substrates G are supported are moved downwardly to a processing position of the substrate mounting tables 86. In this case, the top surfaces of the substrate elevating members 88 have the same heights as those of the corresponding substrate mounting tables 86, respectively; and the substrate elevating members serve as parts of the substrate mounting tables 86. Accordingly, the substrates G are respectively mounted on the corresponding substrate elevating members 88. At this time, the latch rods 93 are respectively positioned in the cavities 88a without being in contact with the substrate elevating members 88.

Next, the gate valve 61 is closed, and the vessel 81 is then exhausted by the gas exhaust chamber 124 and the vessel 81 is set to a predetermined depressurized state by introducing a pressure-control gas into the vessel 81 from a pressure-control gas supply source 103 if necessary. Then, the substrates G mounted on the substrate mounting tables 86 are respectively heated to a predetermined temperature by heating the substrate mounting tables 86 by the heaters 87 in order to perform the preheating process on the substrates G.

Figure 8A:
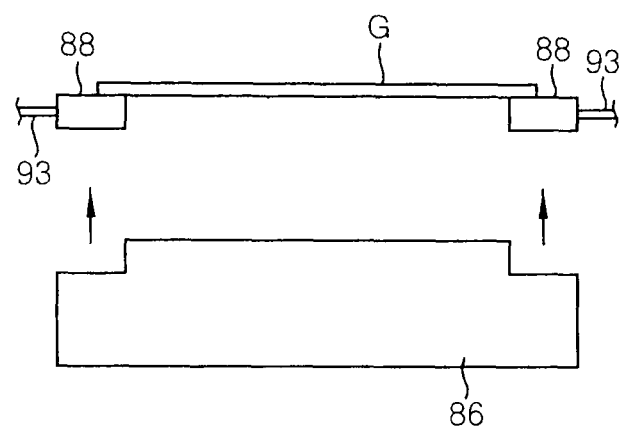
FIGS. 8A to 8C illustrate how the substrate is dismounted and transferred from the substrate mounting table.
Figure 8B:
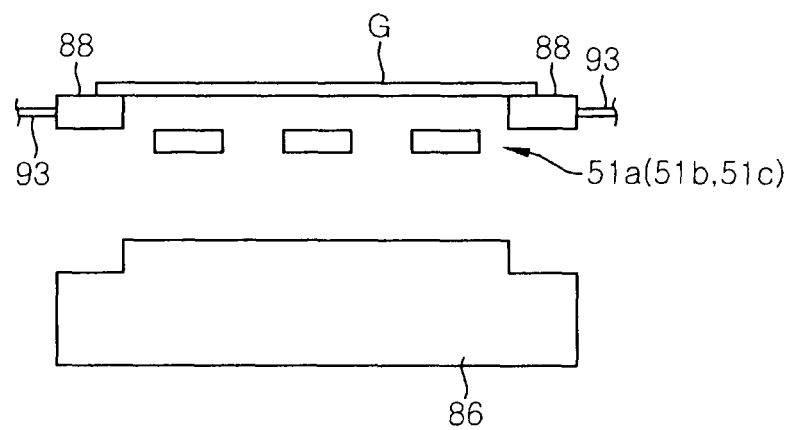
Figure 8C:
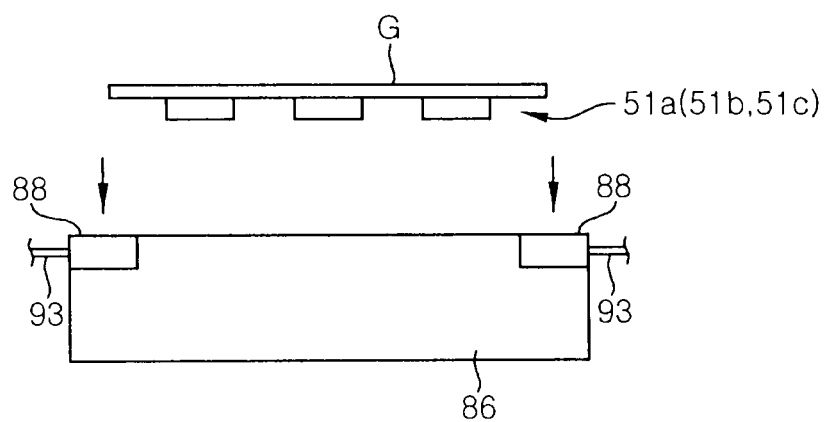

Once the preheating process is completed, the substrate elevating members 88 are moved upwardly to the delivery positions by the elevating units 97 as shown in FIG. 8A. Accordingly, the substrates G supported on the substrate support members 88 are moved upwardly to the delivery positions. Then, as shown in FIG. 8B, the gate valve 61 is opened, and the substrate support arms 51a, 51b, and 51c of the substrate transfer device 50 are moved into the vessel 81 and inserted below the substrates G, respectively. Next, as shown in FIG. 8C, the substrate elevating members 88 are moved downwardly, and the preheated substrates G are respectively taken on the substrate elevating members 88 of the substrate support arms 51a, 51b, and 51c. Thereafter, the substrate support arms 51a, 51b, and 51c on which the substrates G are respectively taken return to the common transfer chamber 10, and the gate valve is closed. In this way, one cycle of an operation of performing the preheating process on the substrates G is completed.

In accordance with the present embodiment, the substrates G are transferred by using the substrate elevating members 88 that are moved upwardly while supporting end portions of the substrates G; and moved downwardly to form parts of the substrate mounting tables 86, instead of using the conventional method of forming holes on a mounting table main body and inserting lift pins through the formed holes. Accordingly, when the substrates G are respectively mounted on the substrate mounting tables 86, both portions of the substrate elevating members 88 on which the substrates G are supported and portions of the substrate mounting tables 86 on which the substrates G are supported are respectively heated by the heaters 87, thereby suppressing the non-uniformity of the in-plane temperature of the substrates G.

In addition, since each of the substrate elevating members 88 is formed to have a comb shape and the substrates G are supported on only the protrusions 88b of the substrate elevating members 88, it is possible to significantly reduce portions of the substrates G having different temperatures from that of the portions thereof supported on the substrate mounting tables 86. Accordingly, it is possible to increase the in-plane temperature uniformity of the substrates much more. In this case, it is preferable to make the width of the protrusions 88b narrow to the utmost in the range where the substrates G can be supported on the protrusions 88b.

Moreover, when the substrate elevating members 88 are moved downwardly to the processing position, the latch rods are positioned in the cavities 88a without being in contact with the substrate elevating members 88 as described above. Accordingly, the heat supplied from the heaters 87 to the substrate elevating members 88 is prevented from being dissipated via the latch rod 93, the connection member 94, and the connection shaft 95. Therefore, since there occurs no temperature reduction of the substrate elevating members 88 caused by such dissipation of the heat, it is possible to improve the in-plane temperature uniformity of the substrates G.

Further, since the cavities 88a are actually provided apart from the protrusions 88b for supporting the substrates G, the heat transfer to the substrates G is not adversely affected by the presence of the cavities 88a.

Besides, since three substrates are transferred at a time and are preheated by the preheating chamber 20, it is possible to improve the processing efficiency.

The present invention is not limited to the aforementioned embodiment, and various modifications may be made. For example, although the present invention is applied to the embodiment that the substrates are subjected to the preheating process in the preheating chamber 20, the present invention is not limited thereto. The present invention may be applied to any embodiments including a heating process for heating a substrate via a substrate mounting table. For example, in the processing chamber 30a or 30b of the above-mentioned embodiment, a film-forming process is carried out while the substrates G are heated. Accordingly, the processing chamber 30a or 30b can employ one or more substrate mounting mechanisms having a substantially same configuration as those of the substrate mounting mechanisms 84a, 84b, and 84c; and a processing gas supply unit for supplying a processing gas for film formation to substrates on the substrate mounting mechanisms.

Furthermore, the present invention is not limited to the heating process. The present invention may be applied to a process, such as an etching process, performed by supplying a cold heat to a substrate. In this case, the heater 87 may be replaced with a heat source, e.g., a chiller, for supplying a cold heat. Besides, even though the processing system in accordance with the aforementioned embodiment transfers and processes three substrates at a time, the present invention is also not limited thereto. One or more (other than three) substrates may be transferred and processed at a time. Moreover, the present invention is not limited to both the shape of processing system shown in FIG. 1 and the comb shape of the substrate mounting member. The substrate mounting member may have any shape capable of supporting the substrate.

In accordance with the present embodiment, a substrate elevating member is employed, the substrate elevating member moving a substrate upwardly while supporting an end portion thereof and forming a part of a substrate mounting table at a first position where the substrate is mounted on the substrate mounting table. Accordingly, when the substrate is mounted on the substrate mounting table, a heat or a cold heat is supplied from a heat source to both a portion of the substrate elevating member on which the substrate is supported and a portion of the substrate mounting table on which the substrate is supported, thereby suppressing the non-uniformity of the in-plane temperature of the substrate.

While the invention has been shown and described with respect to the embodiments, it will be understood by those skilled in the art that various changes and modifications may be made without departing from the scope of the invention as defined in the following claims.

What is claimed is:

1. A substrate mounting mechanism comprising:
    a substrate mounting table for mounting a substrate thereon;
    a substrate elevating member having a substrate supporting portion for supporting an end portion of the substrate, the substrate elevating member being movable upwardly and downwardly between a first position at which the substrate is mounted on the substrate mounting table and a second position that is located above the first position; and
    an elevating unit for upwardly and downwardly moving the substrate elevating member,
    wherein, at the first position, the substrate elevating member is mounted on the substrate mounting table and the end portion of the substrate is supported by the substrate supporting portion of the substrate elevating member so that the substrate elevating member serves as a part of the substrate mounting table,
    wherein the substrate elevating member has a protrusion protruding to an inward side of the substrate mounting table, and the protrusion serves as the substrate supporting portion of the substrate elevating member, and
    wherein the substrate elevating member has a comb shape by having the protrusion in plural number.

2. The mechanism of claim 1, wherein a top surface of the substrate mounting table is flush with a top surface of the substrate supporting portion of the substrate elevating member when the substrate elevating member is located at the first position.

3. The mechanism of claim 1, further comprising a heater provided in the substrate mounting table.

4. A substrate mounting mechanism comprising:
    a substrate mounting table for mounting a substrate thereon;
    a substrate elevating member having a substrate supporting portion for supporting an end portion of the substrate, the substrate elevating member being movable upwardly and downwardly between a first position at which the substrate is mounted on the substrate mounting table and a second position that is located above the first position; and
    an elevating unit for upwardly and downwardly moving the substrate elevating member,
    wherein, at the first position, the substrate elevating member is mounted on the substrate mounting table and the end portion of the substrate is supported by the substrate supporting portion of the substrate elevating member so that the substrate elevating member serves as a part of the substrate mounting table,
    wherein the elevating unit includes a latch member extending horizontally to the inward side of the substrate mounting table and engaging with the substrate elevating member to upwardly and downwardly move the substrate elevating member, and the latch member is disengaged from the substrate elevating member when the substrate elevating member is located at the first position.

5. The mechanism of claim 4, wherein the substrate elevating member has a cavity corresponding to a portion where the latch member is engaged with the substrate elevating member, and when the substrate elevating member is located at the first position, the latch member is located in the cavity while being disengaged from the substrate elevating member.

6. The mechanism of claim 4, wherein a top surface of the substrate mounting table is flush with a top surface of the substrate supporting portion of the substrate elevating member when the substrate elevating member is located at the first position.

7. The mechanism of claim 4, wherein the substrate elevating member has a protrusion protruding to an inward side of the substrate mounting table, and the protrusion serves as the substrate supporting portion of the substrate elevating member.

8. The mechanism of claim 7, wherein the substrate elevating member has a cavity corresponding to a portion where the latch member is engaged with the substrate elevating member, and when the substrate elevating member is located at the first position, the latch member is located in the cavity while being disengaged from the substrate elevating member, and
    wherein the cavity is provided apart from the protrusion in the substrate elevating member.

9. The mechanism of claim 7, wherein the substrate elevating member has a comb shape by having the protrusion in plural number.

10. A substrate processing apparatus comprising:
    a vessel for accommodating a substrate therein; and
    a substrate mounting mechanism including:
        a substrate mounting table for mounting a substrate thereon in the vessel;
        a source configured to heat or cool the substrate via the substrate mounting table;
        a substrate elevating member having a substrate supporting portion for supporting an end portion of the substrate, the substrate elevating member being movable upwardly and downwardly between a first position at which the substrate is mounted on the substrate mounting table and a second position that is located above the first position; and
        an elevating unit for upwardly and downwardly moving the substrate elevating member,
        wherein, at the first position, the substrate elevating member is mounted on the substrate mounting table and the end portion of the substrate is supported by the substrate supporting portion of the substrate elevating member so that the substrate elevating member serves as a part of the substrate mounting table,
        wherein the substrate elevating member has a protrusion protruding to an inward side of the substrate mounting table, and the protrusion serves as the substrate supporting portion of the substrate elevating member, and
        wherein the substrate elevating member has a comb shape by having the protrusion in plural number.

11. The apparatus of claim 10, further comprising the substrate mounting mechanism in plural number to process a plurality of substrates at a time.

12. The apparatus of claim 10, further comprising a processing gas supply unit for supplying a processing gas to the vessel.

* * * * *